United States Patent
Kim et al.

(10) Patent No.: US 12,010,862 B2
(45) Date of Patent: Jun. 11, 2024

(54) ELECTROLUMINESCENT DEVICES WITH HYBRID ORGANIC-INORGANIC TRANSPORT LAYERS

(71) Applicant: Shoei Chemical Inc., Tokyo (JP)

(72) Inventors: Daekyoung Kim, Santa Clara, CA (US); Ruiqing Ma, Morristown, NJ (US); Emma Dohner, Redwood City, CA (US); Donald Zehnder, San Carlos, CA (US)

(73) Assignee: SHOEI CHEMICAL INC., Tokyo (JP)

( * ) Notice: Subject to any disclaimer, the term of this patent is extended or adjusted under 35 U.S.C. 154(b) by 210 days.

(21) Appl. No.: 17/507,416

(22) Filed: Oct. 21, 2021

(65) Prior Publication Data

US 2022/0131102 A1    Apr. 28, 2022

Related U.S. Application Data

(60) Provisional application No. 63/104,126, filed on Oct. 22, 2020.

(51) Int. Cl.
*H10K 50/16* (2023.01)
*H10K 50/11* (2023.01)
(Continued)

(52) U.S. Cl.
CPC ............ *H10K 50/16* (2023.02); *H10K 50/11* (2023.02); *H10K 50/115* (2023.02); *H10K 59/35* (2023.02);
(Continued)

(58) Field of Classification Search
CPC ...... H10K 50/16; H10K 50/11; H10K 50/115; H10K 59/35; H10K 71/00; H10K 85/654;
(Continued)

(56) References Cited

U.S. PATENT DOCUMENTS

| | | | |
|---|---|---|---|
| 2010/0140586 A1* | 6/2010 | Char | C09K 11/883 257/14 |
| 2018/0254421 A1* | 9/2018 | Kinge | H10K 71/00 |

(Continued)

FOREIGN PATENT DOCUMENTS

| | | |
|---|---|---|
| EP | 3540807 A1 | 9/2019 |
| EP | 3597724 A1 | 1/2020 |

OTHER PUBLICATIONS

International Search Report and Written Opinion of the International Searching Authority directed to related International Patent Application No. PCT/US2021/056020, dated Jan. 24, 2022; 12 pages.

*Primary Examiner* — Caleb E Henry
(74) *Attorney, Agent, or Firm* — Alleman Hall & Tuttle LLP

(57) ABSTRACT

Embodiments of an electroluminescent device are described. The electroluminescent device includes a substrate, a first electrode disposed on the substrate, an emission layer comprising luminescent nanostructures disposed on the first electrode, a hybrid transport layer disposed on the emission layer, and a second electrode disposed on the hybrid transport layer. The hybrid transport layer includes an organic layer and inorganic nanostructures disposed within the organic layer. The luminescent nanostructures are separated from the inorganic nanostructures by the organic layer.

15 Claims, 10 Drawing Sheets

(51) Int. Cl.
  *H10K 50/115* (2023.01)
  *H10K 59/35* (2023.01)
  *H10K 71/00* (2023.01)
  *H10K 85/60* (2023.01)
  *H10K 101/40* (2023.01)
  *H10K 102/00* (2023.01)

(52) U.S. Cl.
  CPC ............ *H10K 71/00* (2023.02); *H10K 85/654* (2023.02); *H10K 2101/40* (2023.02); *H10K 2102/331* (2023.02)

(58) Field of Classification Search
  CPC ......... H10K 2101/40; H10K 2102/331; H10K 50/165; H10K 50/15; H10K 71/12; H10K 71/15
  See application file for complete search history.

(56) References Cited

U.S. PATENT DOCUMENTS

| | | | |
|---|---|---|---|
| 2019/0011782 A1* | 1/2019 | Pickett | C09K 11/025 |
| 2019/0198796 A1 | 6/2019 | Woo et al. | |
| 2021/0183999 A1* | 6/2021 | Kwon | H01L 31/02725 |
| 2021/0324268 A1* | 10/2021 | Yang | C09K 11/70 |
| 2022/0199924 A1* | 6/2022 | Kobashi | C01B 19/002 |
| 2022/0199925 A1* | 6/2022 | Kobashi | H10K 50/13 |
| 2022/0204844 A1* | 6/2022 | Won | C09K 11/883 |

\* cited by examiner

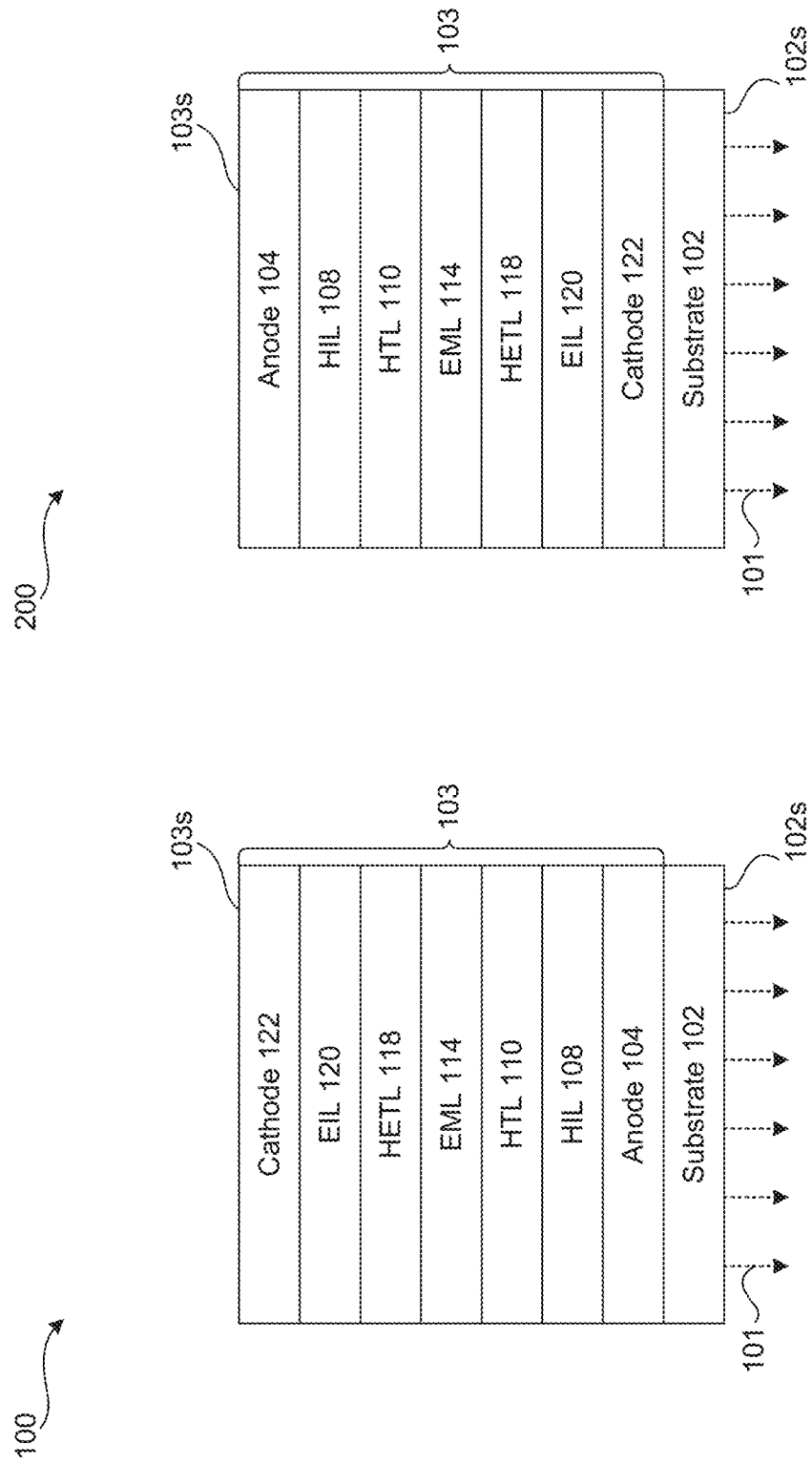

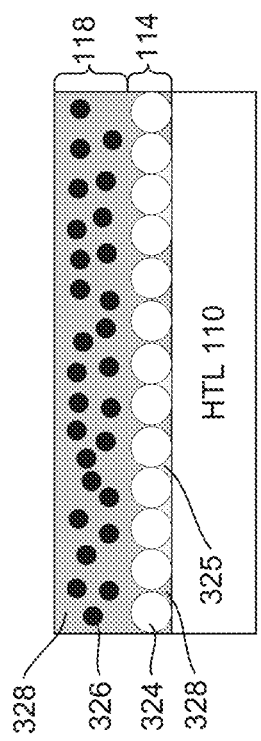
FIG. 4
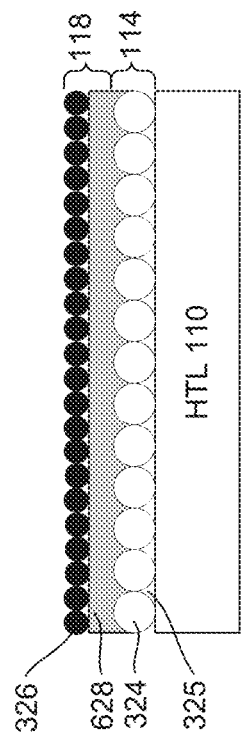
FIG. 6
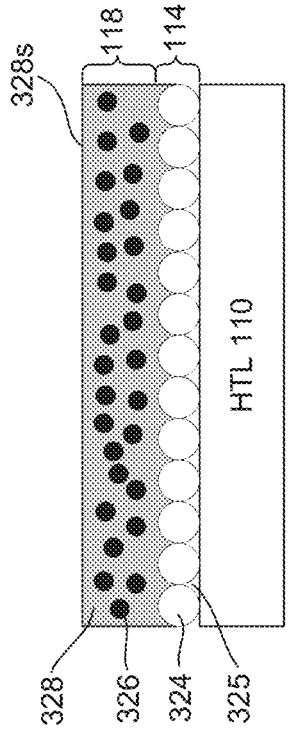
FIG. 3
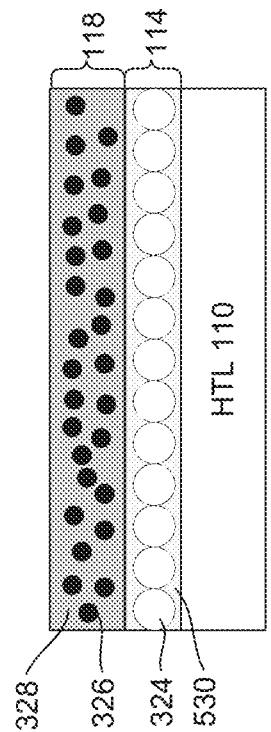
FIG. 5

ELECTROLUMINESCENT DEVICES WITH HYBRID ORGANIC-INORGANIC TRANSPORT LAYERS

BACKGROUND OF THE INVENTION

Field

The present invention relates to electroluminescent devices (e.g., light emitting diodes (LEDs)) having luminescent nanostructure-based (NS-based) emission layers.

Background

Electroluminescent devices are used as light sources in displays (e.g., phones, tablets, monitors, televisions, or digital billboards) and medical applications (e.g., photomedicine). An electroluminescent device can have a pair of transport layers and an emission layer interposed between the transport layers. Light can be emitted though one of the transport layers when a voltage is applied across the stack of transport layers and emission layer during operation. The light can be produced when the voltage is applied because electrons and holes recombine in the emission layer to release photons. The electrons and holes can be injected into the emission layer from electrodes disposed on the transport layers. The emission layer can include a luminescent organic film or luminescent NSs (e.g., luminescent quantum dots (QDs)). An electroluminescent device with luminescent organic film-based emission layer can be referred to as OLED and an electroluminescent device with luminescent NS-based emission layer can be referred to as QDLED.

One of the challenges with QDLEDs is producing QDLEDs that emit light with high luminance (also referred to as brightness) (e.g., luminance greater than about 10,000 candelas per square meter ($cd/m^2$)) at low driving voltages (e.g., voltages less than about 6 volts (V)), for example. The external quantum efficiency (EQE) of the QDLEDs decreases (e.g., greater than 10%) at high luminance (e.g., luminance equal to or greater than about 10,000 $cd/m^2$), an effect known as efficiency roll-off, and QDLEDs have significant efficiency roll-off at high luminance. Another challenge is manufacturing QDLEDs with low efficiency roll-off at low costs with simple processing technologies for ease of mass production.

SUMMARY

The present disclosure provides example inexpensive QDLEDs with high luminance at low driving voltages and with low efficiency roll-off at high luminance. The present disclosure also provides example inexpensive methods for fabricating the same.

According to some embodiments, an electroluminescent device includes a substrate, a first electrode disposed on the substrate, an emission layer with luminescent nanostructures disposed on the first electrode, a hybrid transport layer disposed on the emission layer, and a second electrode disposed on the hybrid transport layer. The hybrid transport layer includes an organic layer and inorganic nanostructures disposed within the organic layer. The luminescent nanostructures are separated from the inorganic nanostructures by the organic layer.

According to some embodiments, an organic material of the organic layer and an inorganic material of the inorganic nanostructures are soluble in a common organic solvent.

According to some embodiments, an organic material of the organic layer and an inorganic material of the inorganic nanostructures are soluble in alcohol, acetone, or acetonitrile.

According to some embodiments, the organic layer includes an organic material with two or more phosphoryl ("phosphonic oxide," herein) functional groups (P=O).

According to some embodiments, the organic layer includes (1,3,5-Triazine-2,4,6-triyl)tris(benzene-3,1-diyl) tris(diphenylphosphine oxide), 2,4,6-Tris[3-(diphenylphosphinyl)phenyl]-1,3,5-triazine, which has three phosphonic oxide functional groups (P=O).

According to some embodiments, the inorganic nanostructures comprise a metal oxide.

According to some embodiments, the inorganic nanostructures comprise diameters about 5 to about 20 times smaller than diameters of the luminescent nanostructures.

According to some embodiments, the luminescent nanostructures comprise quantum dots configured to emit light in a visible spectrum.

According to some embodiments, the luminescent nanostructures are disposed within a matrix material that is disposed on the emission layer.

According to some embodiments, the luminescent nanostructures comprise a first population of quantum dots configured to emit red light and a second population of quantum dots configured to emit green light.

According to some embodiments, the electroluminescent device further comprises a hole transport layer disposed between the first electrode and the emission layer.

According to some embodiments, a display device includes an array of pixels and a display screen disposed on the array of pixels. Each pixel of the array of pixel includes first and second electroluminescent devices. Each of the first and second electroluminescent devices includes an emission layer with luminescent nanostructures and a hybrid transport layer disposed on the emission layer. The hybrid transport layer includes an organic layer and inorganic nanostructures. The emission layer of the first electroluminescent device is configured to emit a first light having a first peak wavelength. The emission layer of the second electroluminescent device is configured to emit a second light having a second peak wavelength that is different from the first peak wavelength.

According to some embodiments, the inorganic nanostructures are disposed on the organic layer.

According to some embodiments, the luminescent nanostructures are separated from the inorganic nanostructures by the organic layer.

According to some embodiments, the organic layer includes an organic material with two or more phosphonic oxide functional groups (P=O).

According to some embodiments, the organic layer includes (1,3,5-Triazine-2,4,6-triyl)tris(benzene-3,1-diyl) tris(diphenylphosphine oxide), 2,4,6-Tris[3-(diphenylphosphinyl)phenyl]-1,3,5-triazine, which has three phosphonic oxide functional groups (P=O).

According to some embodiments, an organic material of the organic layer and an inorganic material of the inorganic nanostructures are soluble in a common organic solvent.

According to some embodiments, a method of fabricating an electroluminescent device includes providing a substrate with a layer of anode material, forming a hole transport layer on the layer of anode material, forming a layer of quantum dots on the hole transport layer, forming a hybrid transport layer with an organic layer and inorganic nanostructures on the layer of quantum dots, and forming a cathode on the hybrid transport layer.

According to some embodiments, the forming the hybrid transport layer includes preparing a solution with the inorganic nanostructures and an organic material of the organic layer in an organic solvent.

According to some embodiments, the forming the hybrid transport layer includes preparing a first solution with the inorganic nanostructures in a first solvent and preparing a second solution with an organic material of the organic layer in a second solvent that is different form the first solvent.

According to some embodiments, the forming the hybrid transport layer includes preparing a solution with an organic material having two or more phosphonic oxide functional groups (P=O).

According to some embodiments, the forming the hybrid transport layer includes preparing a solution with (1,3,5-Triazine-2,4,6-triyl)tris(benzene-3,1-diyl)tris(diphenylphosphine oxide), 2,4,6-Tris[3-(diphenylphosphinyl)phenyl]-1,3,5-triazine, which has three phosphonic oxide functional groups (P=O).

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present embodiments disclosed herein and, together with the description, further serve to explain the principles of the present embodiments and to enable a person skilled in the relevant art(s) to make and use the present embodiments.

FIGS. 1-2 are schematics of cross-sectional views of bottom emitting electroluminescent devices with hybrid transport layers, according to some embodiments.

FIGS. 3-6 are schematics of cross-sectional views of emission layers and hybrid transport layers of electroluminescent devices, according to some embodiments.

Figure 7:
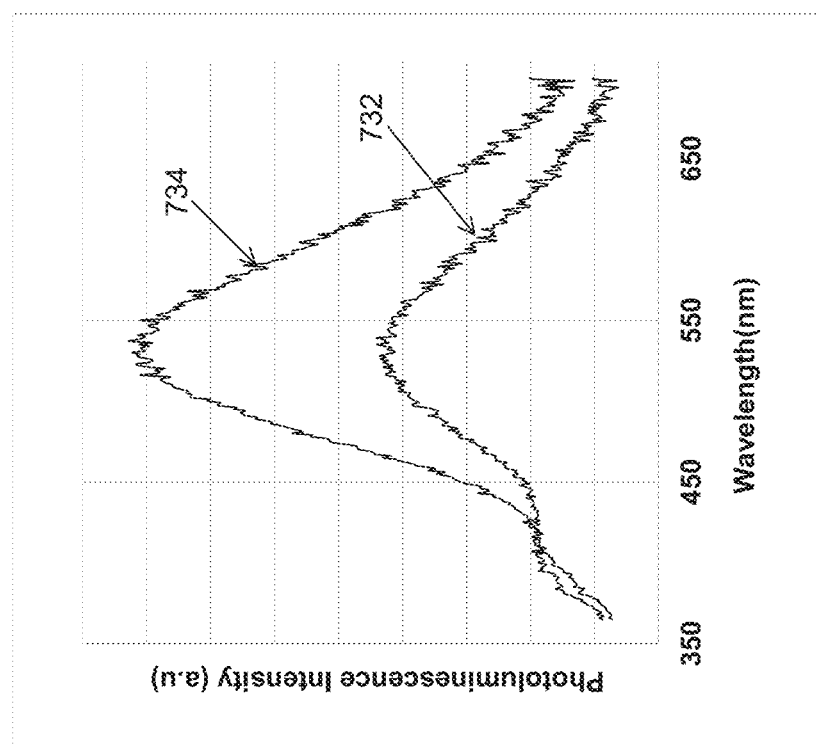
FIGS. 7-11 illustrate characteristics of an electroluminescent device with a hybrid transport layer, according to some embodiments.

The features and advantages of the present invention will become more apparent from the detailed description set forth below when taken in conjunction with the drawings, in which like reference characters identify corresponding elements throughout. In the drawings, like reference numbers indicate identical, functionally similar, and/or structurally similar elements unless mentioned otherwise. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein. It should be appreciated that the particular implementations shown and described herein are examples and are not intended to otherwise limit the scope of the application in any way.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

In embodiments, the term "display device" refers to an arrangement of elements that allow for the visible representation of data on a display screen. Suitable display screens can include various flat, curved or otherwise-shaped screens, films, sheets or other structures for displaying information visually to a user. Display devices described herein can be included in, for example, display systems encompassing a liquid crystal display (LCD), televisions, computers, monitors, mobile phones, smart phones, personal digital assistants (PDAs), gaming devices, electronic reading devices, digital cameras, tablets, wearable devices, car navigation systems, digital signage, augmented reality, virtual reality, and the like.

The term "about" as used herein indicates the value of a given quantity varies by ±10% of the value. For example, "about 100 nm" encompasses a range of sizes from 90 nm to 110 nm, inclusive.

The term "substantially" as used herein indicates the value of a given quantity varies by ±1% to ±5% of the value.

In embodiments, the term "optically coupled" means that components are positioned such that light is able to pass from one component to another component without substantial interference.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm.

Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In some embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell can contain non-crystalline regions and can even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (QY) as used herein refers to the ratio of photons emitted to photons absorbed, e.g., by a nanostructure or population of nanostructures. As known in the art, quantum yield is typically determined by a comparative method using well-characterized standard samples with known quantum yield values.

The term "primary emission peak wavelength" as used herein refers to the wavelength at which the emission spectrum exhibits the highest intensity.

The term "full width at half-maximum" (FWHM) as used herein refers to refers to a measure of spectral width. In the case of an emission spectrum, a FWHM can refer to a width of the emission spectrum at half of a peak intensity value.

The term Forster radius used herein is also referred as Forster distance in the art.

The term "nanostructure (NS) film" is used herein to refer to a film having luminescent nanostructures.

The term "red wavelength region" is used herein to refer to a wavelength region of the visible spectrum that can include wavelengths ranging from about 620 nm to about 750 nm, according to some embodiments.

The term "green wavelength region" is used herein to refer to a wavelength region of the visible spectrum that can include wavelengths ranging from about 495 nm to about 570 nm, according to some embodiments.

The term "blue wavelength region" is used herein to refer to a wavelength region of the visible spectrum that can include wavelengths ranging from about 435 nm to about 495 nm, according to some embodiments.

The published patents, patent applications, websites, company names, and scientific literature referred to herein are hereby incorporated by reference in their entirety to the same extent as if each was specifically and individually indicated to be incorporated by reference. Any conflict between any reference cited herein and the specific teachings of this specification shall be resolved in favor of the latter. Likewise, any conflict between an art-understood definition of a word or phrase and a definition of the word or phrase as specifically taught in this specification shall be resolved in favor of the latter.

Technical and scientific terms used herein have the meaning commonly understood by one of skill in the art to which the present application pertains, unless otherwise defined. Reference is made herein to various methodologies and materials known to those of skill in the art.

Example Embodiments of Electroluminescent Devices With Hybrid Transport Layers

FIG. 1 illustrates a schematic of a cross-sectional view of a bottom emitting electroluminescent device 100, according to some embodiments. In some embodiments, electroluminescent device 100 can be used as a light source in display devices to generate images on the display devices. In some embodiments, electroluminescent device 100 can be configured to emit light with high luminance (e.g., luminance equal to or greater than about 10,000 cd/m$^2$) at low driving voltages (e.g., voltages less than about 6 volts (V)) and at one or more primary emission peak wavelengths in the visible spectrum (e.g., primary emission peak wavelengths within a range of about 435 nm to about 750 nm).

In some embodiments, electroluminescent device 100 can include a substrate 102 and a device stack 103 disposed on substrate 102. Substrate 102 can be configured to support device stack 103 and optionally to support a control circuitry (not shown) for controlling operation of device stack 103. In some embodiments, substrate 102 can be optically transparent to allow light 101 generated by device stack 103 to be emitted through substrate 102 without substantially absorbing light 101. Light 101 emitted from device stack 103 is represented in FIG. 1 by black arrows pointing towards -Z-direction.

In some embodiments, substrate 102 can include a conductive material and can have a vertical dimension (e.g., thickness) along a Z-axis ranging from about 10 μm to about 150 μm (e.g., about 10 μm, about 12 μm, about 25 μm, about 75 μm, about 100 μm, about 125, μm or about 150 μm). In some embodiments, surface 102s of substrate 102 can serve as a screen to display images generated using light 101. In some embodiments, substrate 102 can serve as an encapsulation layer to provide environmental protection to electroluminescent device 100.

Device stack 103 can include an anode 104 disposed on substrate 102, a hole injection layer (HIL) 108 disposed on anode 104, a hole transport layer (HTL) 110 disposed on HIL 108, an emission layer (EML) 114 disposed on HTL 110, a hybrid electron transport layer (HETL) 118 disposed on EML 114, an electron injection layer (EIL) 120 disposed on HETL 118, and a cathode 122 disposed on EIL 120, according to some embodiments. In some embodiments, device stack 103 can include HTL 110 disposed on anode 104, and cathode 122 disposed on HETL 118, without HIL 108 and EIL 120.

Electroluminescent device 100 can be configured to emit light 101 in the visible spectrum (e.g., red, green, or blue) based on the composition of EML 114. EML 114 can include one or more layers of luminescent NSs, one or more luminescent organic layers, or a combination thereof. In some embodiments, the one or more layers of luminescent NSs can include one or more layers of luminescent QDs 324, which are disposed on HTL 110 without a matrix material, as shown in FIGS. 3-4 and 6. Each of luminescent QDs 324 can be similar to a NS 1500, as described below with reference to FIG. 15. In some embodiments, EML 114 can include one or more QD films with luminescent QDs 324 disposed within a matrix material 530, as shown in FIG. 5. The QD films can be similar to a NS film 1600, as described below with reference to FIG. 16.

FIGS. 3-6 illustrate different configurations of EML 114 and HETL 118 of device stack 103, according to some embodiments. Though one layer of QDs 324 is shown in FIGS. 3-6, EML 114 can have any number of layers of QDs 324. Though QDs 324 are shown in FIGS. 3-6 to have similar dimensions, QDs 324 can have dimensions different from each other. Further, though QDs 324 are shown in FIGS. 3-6 to be aligned in a row and in physical contact with adjacent QDs 324, EML 114 can have QDs 324 arranged in a row that are misaligned with each other and/or can have one or more QDs 324 spaced apart from adjacent QDs 324.

The size and material of QDs 324 in EML 114 can be selected based on the desired color (e.g., red, green, or blue) of light 101 emitted through substrate 102. In some embodiments, the size and material of QDs 324 in EML 114 can be selected to emit light 101 having a primary emission peak wavelength in the red wavelength region (e.g., wavelengths ranging from about 620 nm to about 750 nm), in the green wavelength region (e.g., wavelengths ranging from about 495 nm to about 570 nm), or in the blue wavelength region (e.g., wavelengths ranging from about 435 nm to about 495 nm) of the visible spectrum. In some embodiments, EML 114 can have a single population of QDs 324 configured to emit red, green, blue, or any light in the visible spectrum. In some embodiments, EML 114 can have two or more populations of QDs 324, in which each population of QDs 324 is configured to emit a light in the visible spectrum different from the other populations of QDs 324. In some embodiments, EML 114 can include indium phosphide (InP) based QDs 324 having diameters ranging from about 4 nm to about 20 nm.

Light 101 with primary emission peak wavelength in the visible spectrum can be generated from EML 114 and emitted from electroluminescent device 100 when a voltage is applied across device stack 103 during operation. Light 101 can be generated when the voltage is applied because electrons and holes recombine in EML 114 to release photons corresponding to wavelengths in the visible wavelength regions. The electrons and holes can be injected from cathode 122 and anode 104, respectively, when the voltage is applied such that anode 104 is positive with respect to cathode 122.

Referring to FIGS. 1 and 3-6, HETL 118 can be formed on EML 114 and can be configured to facilitate the transportation of electrons from EIL 120 to EML 114. HETL 118 can be further configured to block holes from escaping EML 114 during operation. In some embodiments, HETL 118 can have a vertical dimension (e.g., thickness) along a Z-axis ranging from about 20 nm to about 120 nm (e.g., about 20 nm, about 40 nm, about 50 nm, about 60 nm, about 80 nm, about 100 nm, or about 120 nm). In some embodiments, HETL 118 can include inorganic NSs 326 disposed within an organic layer 328, which is disposed on EML 114, as shown in FIGS. 3-5. Though FIGS. 3-5 show inorganic NSs 326 are fully embedded within organic layer 328, some of inorganic NSs 326 can partially extend out of surface 328 of organic layer 328, according to some embodiments. In some embodiments, inorganic NSs 326 can have diameters about 5 to about 20 times smaller than diameters of QDs 324. In some embodiments, inorganic NSs 326 can have diameters ranging from about 2 nm to about 5 nm.

In some embodiments, HETL 118 can include inorganic NSs 326 disposed on organic layer 628, which is disposed on EML 114, as shown in FIG. 6. Though one layer of inorganic NSs 326 is shown in FIG. 6, HETL 118 of FIG. 6 can have any number of layers of inorganic NSs 326. Though inorganic NSs 326 are shown in FIG. 6 to be aligned in a row and in physical contact with adjacent inorganic NSs 326, inorganic NSs 326 can be arranged in a row that are misaligned with each other and/or that are spaced apart from adjacent inorganic NSs 326. Further, though inorganic NSs 326 are shown in FIGS. 3-6 to have similar dimensions and spherical shapes, inorganic NSs 326 can have dimensions different from each other and can have any geometric shape.

Referring to FIGS. 3-4, portions of organic layer 328 can be absent (FIG. 3) or present (FIG. 4) within gaps 325 between QDs 324. If QDs 324 are closely packed, portions of organic layer 328 may not diffuse through the one or more layers of QDs 324 during the formation of HETL 118 and may not be present within gaps 325, as shown in FIG. 3. On the other hand, if QDs 324 are loosely packed, portions of organic layer 328 may diffuse through the one or more layers of QDs 324 during the formation of HETL 118 and fill some (or all) of gaps 325 and contact HTL 110, as shown in FIG. 4. The diffusion of the portions of organic layer 328 can also depend on the deposition method of organic layer 328. Though FIG. 6 shows portions of organic layer 628 to be absent within gaps 325, in some embodiments, similar to organic layer 328, portions of organic layer 628 can be present within gaps 325 depending on the packing of QDs 324 in EML 114 of FIG. 6 and/or on the deposition method of organic layer 628.

Referring to FIGS. 3-6, organic layers 328 and 628 provide organic interfaces between QDs 324 and inorganic NSs 326 and keep QDs 324 and inorganic NSs 326 spaced apart from each other to prevent optical interactions between QDs 324 and inorganic NSs 326. Any optical interactions between QDs 324 and inorganic NSs 326 when QDs 324 and inorganic NSs 326 are in contact with each other in the absence of organic layer 328 or 628 can cause quenching of luminescence properties (e.g., photoluminescence) of QDs 324. The quenching of luminescence properties of QDs 324 can be due to the presence of surface defects of inorganic NSs 326 at the interfaces between QDs 324 and inorganic NSs 326. The interfacial surface defects can hinder the generation and/or emission of photons from QDs 324, and consequently induce a quenching effect on the luminescence properties of QDs 324. Thus, the presence of organic layer 328 or 628 at the interfaces between QDs 324 and inorganic NSs 326 improves the luminescence properties of QDs 324. In some embodiments, organic layer 328 can passivate the surface defects of inorganic NSs 326 and prevent or reduce luminescence from inorganic NSs 326 in the visible spectrum.

The organic material and inorganic material of organic layer 328 and inorganic NSs 326, respectively, are selected such that the organic and inorganic materials do not chemically react with each other and are soluble in a common polar organic solvent, such as alcohol, acetone, acetonitrile, or a suitable polar organic solvent that does not damage QDs 324. In some embodiments, the organic material of organic layer 328 can include two or more phosphonic oxide functional groups (P=O). For example, the organic material can include (1,3,5-Triazine-2,4,6-triyl)tris(benzene-3,1-diyl)tris (diphenylphosphine oxide), 2,4,6-Tris[3-(diphenylphosphinyl)phenyl]-1,3,5-triazine (referred to as POT2T), which has three P=O functional groups or Bis[2-(diphenylphosphino) phenyl] ether oxide (referred to as DPEPO), which has two P=O function groups. In some embodiments, the inorganic material of inorganic NSs 326 can include a metal oxide semiconductor (e.g., zinc oxide (ZnO), zinc magnesium oxide (ZnMgO), etc.) or a metal oxide (e.g., titanium oxide ($TiO_2$)).

Referring to FIG. 6, similar to organic layer 328, organic layer 628 can include an organic material that does not chemically react with with the inorganic material of inorganic NSs 326. But, unlike organic layer 328, the organic material of organic layer 628 is insoluble in the polar organic solvent used in the deposition of NSs 326 on organic layer 628.

Referring back to FIG. 1, anode 104 can be configured to inject holes to device stack 103 when positively biased during operation, as discussed above. Anode 104 can include electrically conductive and optically transparent materials such as, for example, indium-tin-oxide (ITO), according to some embodiments. In some embodiments, anode 104 can have a vertical dimension (e.g., thickness) along a Z-axis ranging from about 50 nm to about 150 nm (e.g., about 50 nm, about 80 nm, about 100 nm, about 120 nm, about 125 nm, about 140 nm, or about 150 nm).

HIL 108 can be formed on anode 104. HIL 108 can be configured to facilitate the injection of holes from anode 104 into HTL 110. In some embodiments, HIL 108 can have a vertical dimension (e.g., thickness) along a Z-axis ranging from about 3 nm to about 70 nm (e.g., about 3 nm, about 10 nm, about 30 nm, about 40 nm, about 50 nm, about 60 nm, or about 70 nm). In some embodiments, HIL 108 can include p- or n-type, organic or inorganic semiconductor materials such as, for example, metal oxides (e.g., nickel oxide (NiO), molybdenum oxide ($MoO_3$), vanadium oxide ($V_2O_5$), tungsten oxide ($WO_3$)), polyanilines, polythiophenes (e.g., poly (3,4-ethylenedioxythiophene) (PEDOT) doped with poly (styrene sulfonate) (PSS)), Tris[phenyl(m-tolyl)amino] triphenylamine (mTDATA), or hexaazatriphenylene-hexacarbonitrile (HAT-CN).

In some embodiments, HTL 110 can be formed on HIL 108 as shown in FIG. 1 or on anode 104 if HIL 108 is optionally not included. HTL 110 can be configured to facilitate the transportation of holes from HIL 108 to EML 114. In some embodiments, HTL 110 can have a vertical dimension (e.g., thickness) along a Z-axis smaller than the vertical dimension of HIL 108 and can range from about 10 nm to about 30 nm (e.g., about 10 nm, about 20 nm, or about 30 nm). In some embodiments, HTL 110 can include p-type, organic or inorganic semiconductor materials such as, for example, metal oxides or nanostructures of metal oxides (e.g., nickel oxide (NiO), molybdenum oxide ($MoO_3$), vanadium oxide ($V_2O_5$), or tungsten oxide ($WO_3$)), or polymers (e.g., poly(N-vinylcarbazole), poly(triarylamines), triphenylamine derivatives, or carbazole derivatives), or small organic molecules (e.g. N,N-Di(1-naphthyl)-N,N-diphenyl-(1,1-biphenyl)-4,4-diamine (NPB)). In some embodiments, HTL 110 and HIL 108 can include material similar or different from each other.

EIL 120 can be formed on HETL 118 and can be configured to facilitate the injection of electrons from cathode 122 into HETL 118 by forming an ohmic or near ohmic contact with cathode 122. In some embodiments, EIL 120 can include n-type semiconductor materials, alkali metal salts (e.g., lithium flouride (LiF) or cesium carbonate ($Cs_2CO_3$)), low work function metals (e.g., calcium (Ca), barium (Ba), magnesium (Mg), ytterbium (Yb), or cesium (Cs)), or organic compounds (e.g., polyfluorenes, polyethylenimine ethoxylated (PETE), or lithium-8-hydroxyquinolinolate (Liq)). In some embodiments, HETL 118 and EIL 120 can include material similar or different from each other.

Cathode 122 can be formed directly on EIL 120 or on HETL 118 if EIL 120 is optionally not included. Cathode 122 can be configured to inject electrons to device stack 103 when negatively biased during operation, as discussed above. In some embodiments, cathode 122 can have a vertical dimension (e.g., thickness) along a Z-axis ranging from about 100 nm to about 5 μm (e.g., about 250 nm, about 280 nm, about 300 nm, about 500 nm, about 1 μm, or about 5 μm). Cathode 122 can include electrically conductive and optically reflective materials such as, for example, aluminum (Al) or silver (Ag), according to some embodiments. The reflective materials of cathode 122 can help to reflect light towards substrate 102 and prevent light from being emitted through cathode 122. The light that is produced due to the release of photons after the recombination of electrons and holes in EML 114 (discussed above) can travel towards cathode 122 and substrate 102. The reflective materials of cathode 122 helps to redirect these photons towards substrate 102 for emission from electroluminescent device 100.

In some embodiments, the order of layers of device 103 may be reversed, as shown in electroluminescent device 200 of FIG. 2. The discussion of electroluminescent device 100 applies to electroluminescent device 200, except cathode 122 can include optically transparent materials and anode 104 can include optically reflective materials.

In some embodiments, electroluminescent device 100 can be a top emitting electroluminescent device and light 101 can be emitted through surface 103s of device 103 instead of surface 102s of substrate 102. The discussion of electroluminescent device 100 applies the top emitting electroluminescent device, except substrate 102 can be optically reflective and cathode 122 and anode 104 can be optically transparent.

The elements described in this disclosure as being on or over other elements can be directly on with the other elements or can have intervening layers unless mentioned otherwise. Though some of the elements of FIGS. 1-6 are shown to have similar dimensions along X-, Y-, and/or Z-axes with respect to each other, each of these elements can have dimensions different from each other in one or more directions, without deviating from the scope or spirit of the invention.

Example Characteristics of an Electroluminescent Device With a Hybrid Transport Layer FIG. 7 illustrates (i) a photoluminescence (PL) spectrum 732 of a hybrid ETL (e.g., HETL 118 of FIGS. 3-5) having ZnMgO NSs disposed in a POT2T layer, and (ii) a photoluminescence (PL) spectrum 734 of an ETL having only a layer of ZnMgO NSs. The ZnMgO NSs and POT2T layer can represent inorganic NSs 326 and organic layer 328, respectively, of FIGS. 3-5. The lower intensity of PL spectrum 732 compared to that of PL spectrum 734 indicates that the presence of the POT2T layer reduces the luminescence from the ZnMgO NSs over the range from about 450 nm to about 650 nm. The reduction in the luminescence can be due to the passivation of the surface defects of the ZnMgO NSs by the POT2T layer.

Figure 8:
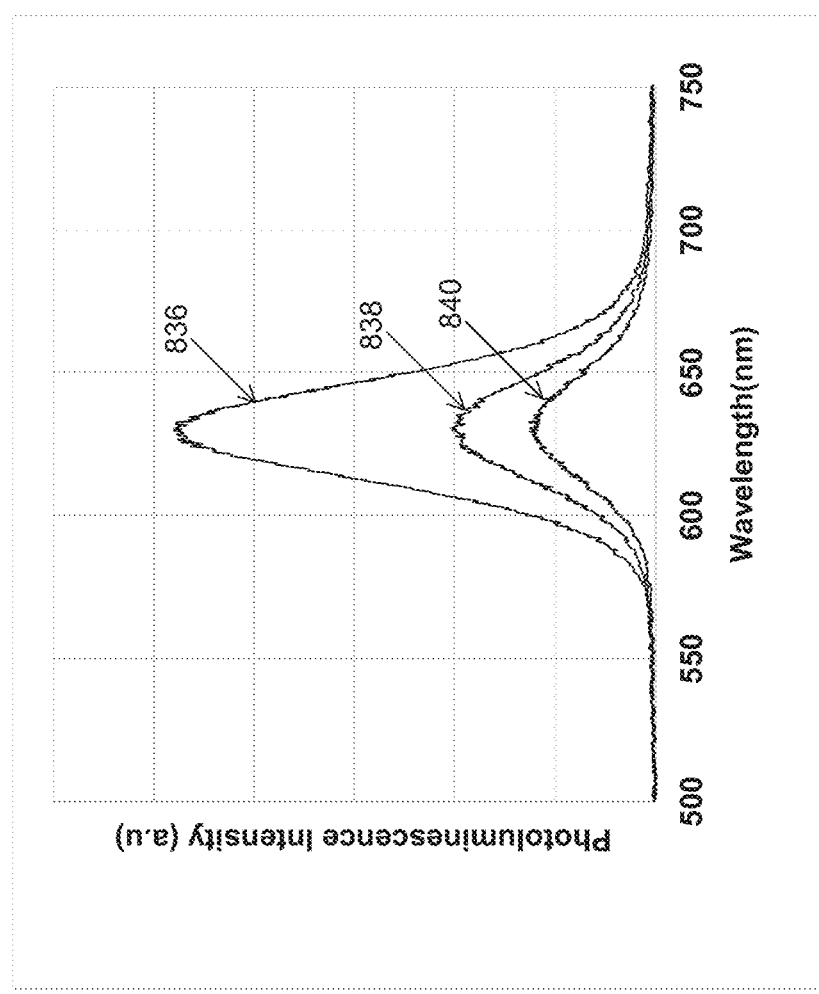

FIG. 8 illustrates (i) a PL spectrum 836 of a layer of InP QDs, (ii) a PL spectrum 838 of an electroluminescence device A (e.g., electroluminescence device 100) with an EML (e.g., EML 114 of FIGS. 3-5) having InP QDs and a hybrid ETL (e.g., HETL 118 of FIGS. 3-5) having ZnMgO NSs disposed in a POT2T layer, and (iii) a PL spectrum 840 of an electroluminescence device B with an EML (e.g., EML 114 of FIGS. 3-5) having InP QDs and an ETL having only a layer of ZnMgO NSs. The InP QDs, ZnMgO NSs, and POT2T layer can represent QDs 324, inorganic NSs 326, and organic layer 328, respectively, of FIGS. 3-5. The higher intensity of PL spectrum 838 compared to that of PL spectrum 840 indicates that the presence of the POT2T layer in the hybrid ETL improves the luminescence properties of electroluminescence device A compared to electroluminescence device B. Further, the higher intensity of PL spectrum 836 compared to that of PL spectra 838 and 840 can indicate that both electroluminescence devices A-B exhibited some degree of PL quenching due to the presence of the ZnMgO NSs in the ETLs.

Figure 9:
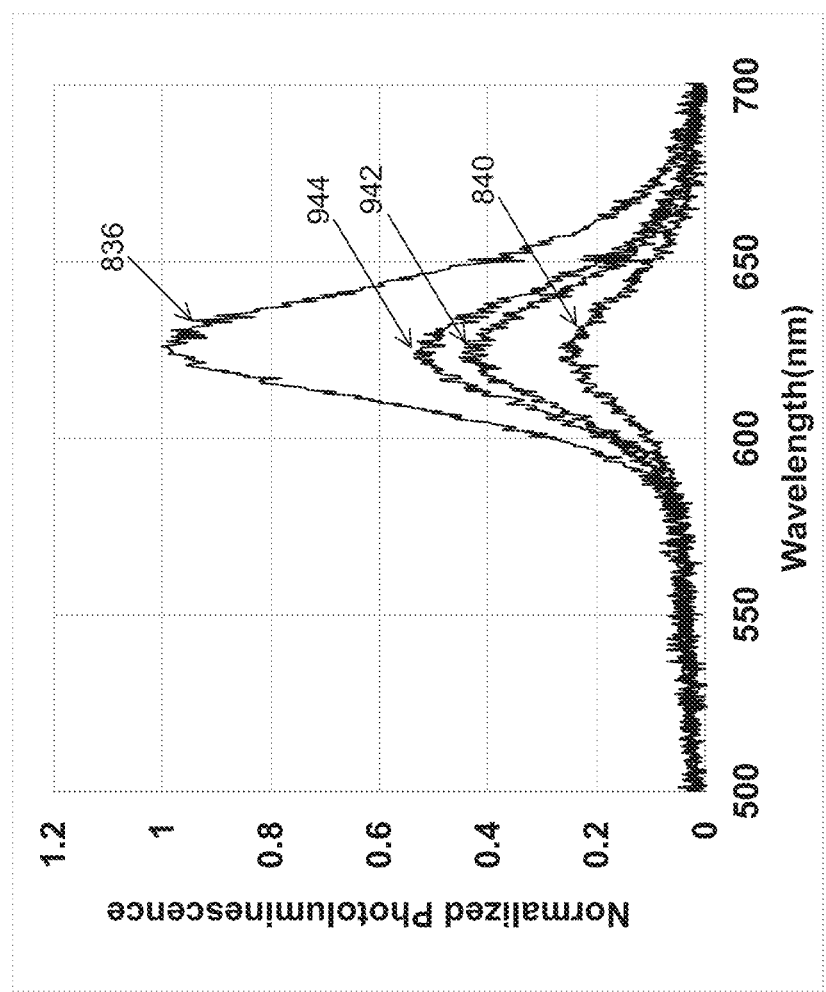

FIG. 9 illustrates (i) PL spectrum 836 of layer of InP QDs and (ii) PL spectrum 840 of electroluminescence device B. FIG. 9 further illustrates PL spectra 942 and 944 of electroluminescence devices C and D, respectively, that have similar EMLs (e.g., EML 114 of FIGS. 3-5) with InP QDs, but different hybrid ETLs (e.g., HETL 118 of FIGS. 3-5) formed with different volume ratios of POT2T to ZnMgO. The hybrid ETL of electroluminescence device C is formed with a volume ratio of POT2T to ZnMgO being about 1:1.5 and the hybrid ETL of electroluminescence device D is formed with a volume ratio of POT2T to ZnMgO being about 4:1. The higher intensity of PL spectrum 944 compared to PL spectra 942 and 840 indicates that increasing the concentration of POT2T in the hybrid ETL improves the luminescence properties of electroluminescence devices.

Figure 10:
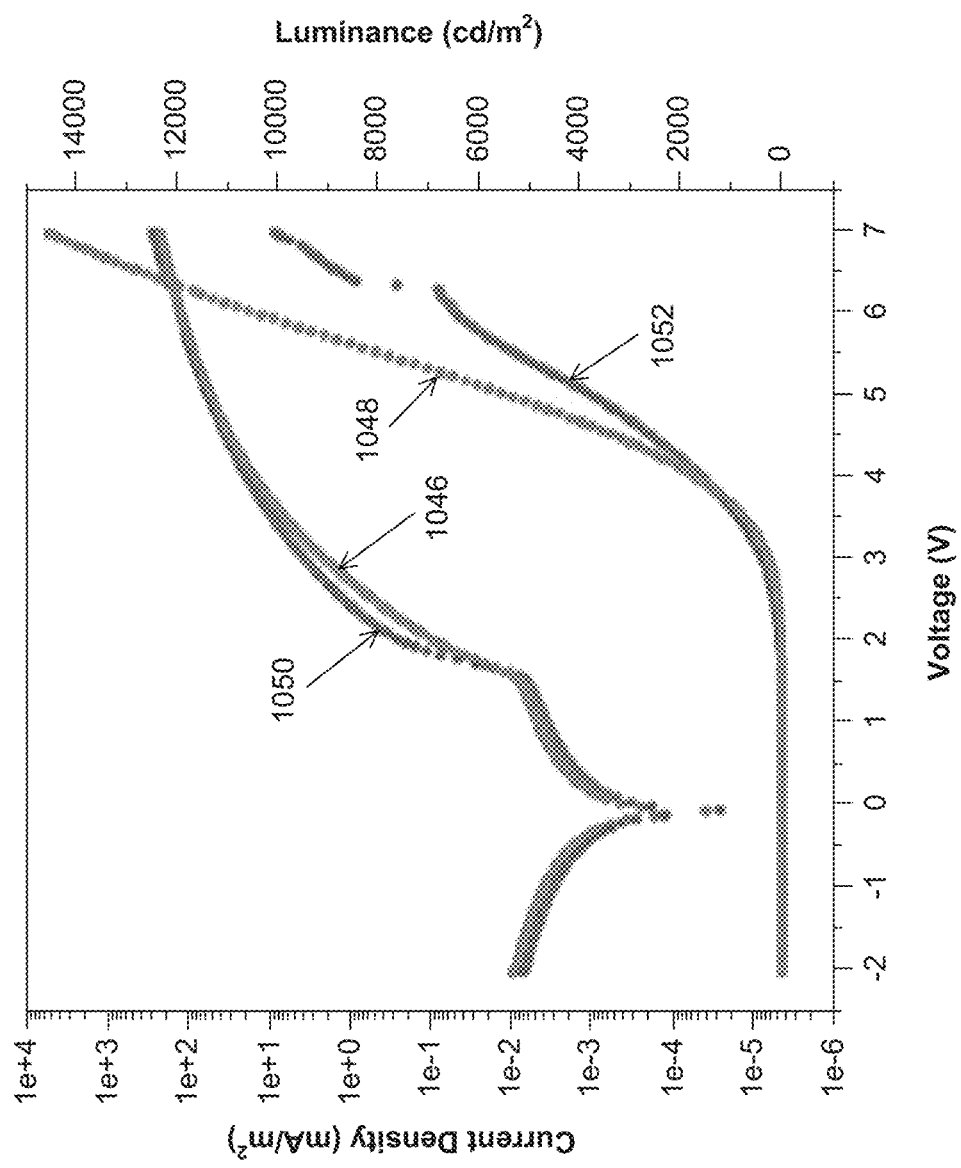

FIG. 10 illustrates (i) a current density vs. driving voltage plot 1046 and a luminance vs. driving voltage plot 1048 for electroluminescence device A, and (ii) a current density vs. driving voltage plot 1050 and a luminance vs. driving voltage plot 1052 for electroluminescence device B. Electroluminescence device A with the hybrid ETL exhibits a higher luminance than that of electroluminescence device B for driving voltages above about 4 V.

Figure 11:
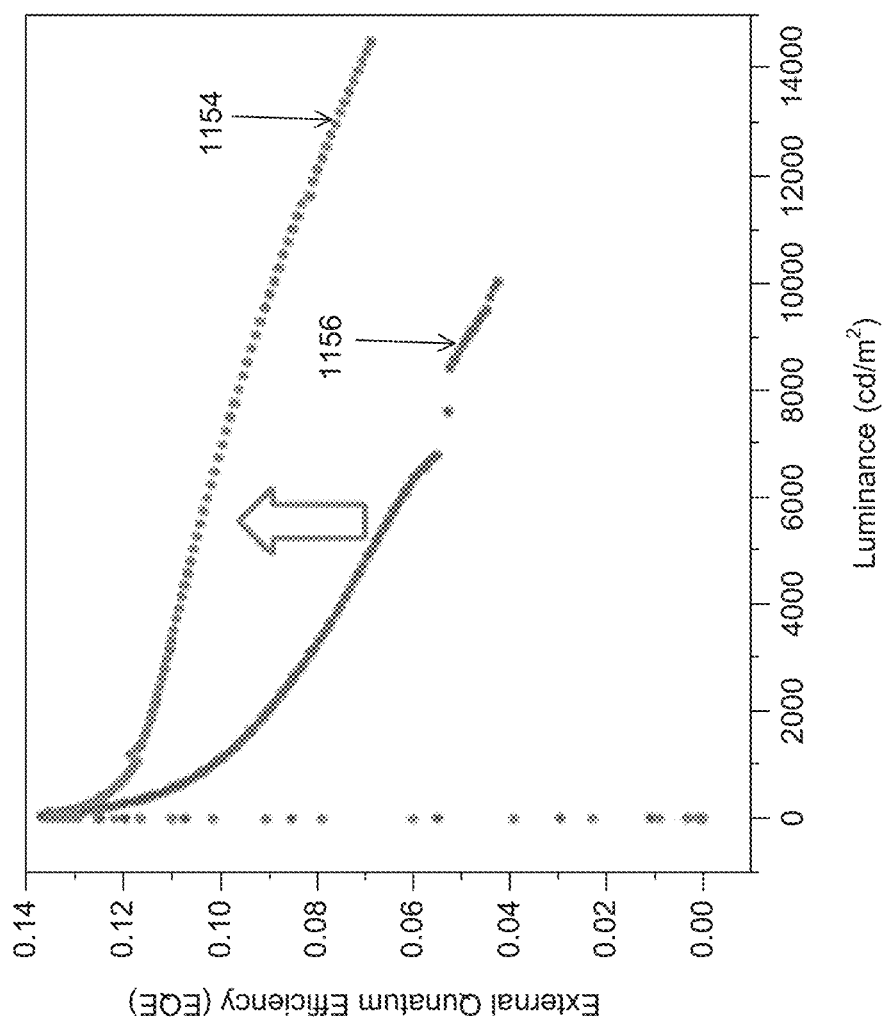

FIG. 11 illustrates (i) an EQE vs luminance plot 1154 for electroluminescence device A, and (ii) an EQE vs luminance plot 1156 for electroluminescence device B. Electroluminescence device A with the hybrid ETL exhibits a higher EQE than that of electroluminescence device B across the entire measured range of luminance. Thus, the use of the hybrid ETL reduces efficiency roll-off of electroluminescence device A.

Figure 12:
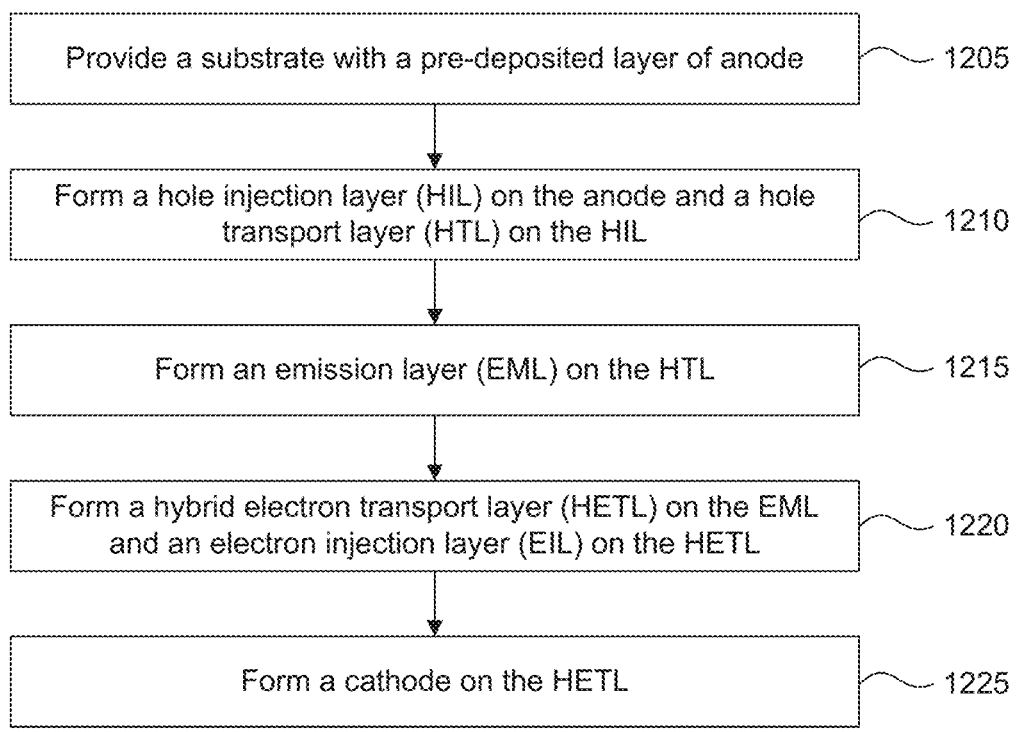
FIG. 12 is a flow diagram of a method for fabricating an electroluminescent device with a hybrid transport layer, according to some embodiments.

Example Methods for Fabricating Electroluminescent Devices With Hybrid Transport Layers FIG. 12 is a flow diagram of an example method 1200 for fabricating electroluminescence device 100, according to some embodiments. Steps can be performed in a different order or not performed depending on specific applications. It should be noted that method 1200 may not produce a complete electroluminescence device. Accordingly, it is understood that additional processes can be provided before, during, and after method 1200, and that some other processes may only be briefly described herein.

In step 1205, a substrate with a pre-deposited layer of anode is provided. For example, as shown in FIG. 1, anode 104 can be disposed on substrate 102. In some embodiments, substrate 102 can be optically transparent and can include a conductive materials. Anode 104 can include electrically conductive and optically transparent materials such as, for example, indium-tin-oxide (ITO), according to some embodiments. In some embodiments, anode 104 can be formed on substrate 102 by depositing and patterning the electrically conductive and optically transparent materials on substrate 102. The deposition can be performed by, for example, sputtering, thermal evaporation, or a suitable method for depositing electrically conductive and optically transparent materials. The patterning can be performed by, for example, a lithography process or a masking process during the deposition.

In step 1210, an HIL is formed on the anode and an HTL is formed on the HIL. For example, as shown in FIG. 1, HIL 108 can be disposed on anode 104 and HTL 110 can be disposed on HIL 108. HIL 108 and HTL 110 can each be deposited on its underlying layer by, for example, spin coating, inkjet printing, slot die coating, nozzle printing, contact printing, a suitable solution printing technology, roll-to-roll processing, thermal evaporation, or a suitable vapor deposition technology. In some embodiments, HIL 108 can include PEDOT (poly(3,4-ethylenedioxythiophene)) doped with PSS (poly(styrene sulfonate)) and HTL 110 can include TFB (poly[(9,9-dioctylfluorenyl-2,7-diyl)-co-(4,4'(N-(4-sec-butylphenyl))) diphenylamine]).

In step 1215, an EML is formed on the HTL. For example, as shown in FIGS. 1 and 3-6, EML 114 can be disposed on HTL 110. In some embodiments, EML 114 can include preparing a 9 mg/ml solution of QDs 324 and depositing the solution on HTL 110 by, for example, spin coating, inkjet printing, slot die coating, nozzle printing, contact printing, a suitable solution printing technology, thermal evaporation, or a suitable vapor deposition technology. In some embodiments, QDs 324 can include indium phosphide (InP) based QDs with a diameter ranging from about 20 nm to about 40 nm and can be configured to emit a primary emission peak wavelength in the red or green wavelength region.

In some embodiments, step 1210 can be an optional step and step 1205 can be followed by step 1215, where the EML is formed on the anode.

In step 1220, an HETL is formed on the EML and an EIL is formed on the HETL. For example, as shown in FIGS. 1 and 3-5, HETL 118 can be disposed on EML 114 and EIL 120 can be disposed on HETL 118. In some embodiments, the formation of HETL 118 can include preparing a solution with inorganic NSs 326 and the organic material of organic layer 328 in a polar organic solvent, such as alcohol, acetone, acetonitrile, or a suitable polar organic solvent that does not damage QDs 324 and depositing the solution on EML 114 by a vapor process or a solution process. In some embodiments, the solution can include a 32 mg/ml solution of ZnMgO nanostructures in ethanol and a 16 mg/ml solution of POT2T in methanol.

EIL 120 can be deposited on HETL 118 by, for example, spin coating, inkjet printing, slot die coating, nozzle printing, contact printing, a suitable solution printing technology, thermal evaporation, or a suitable vapor deposition technology.

In step 1225, a cathode is formed on the EIL. For example, as shown in FIG. 1, cathode 122 can be disposed on EIL 120. Cathode 122 can include electrically conductive and optically reflective materials such as, for example, aluminum (Al) or silver (Ag), according to some embodiments. In some embodiments, cathode 122 can be formed by depositing the cathode materials on EIL 120 by, for example, sputtering, thermal evaporation, a suitable solution printing technology, or a suitable method for depositing electrically conductive and optically reflective materials.

Example Embodiments of LED Display Devices

Figures 13, 14:
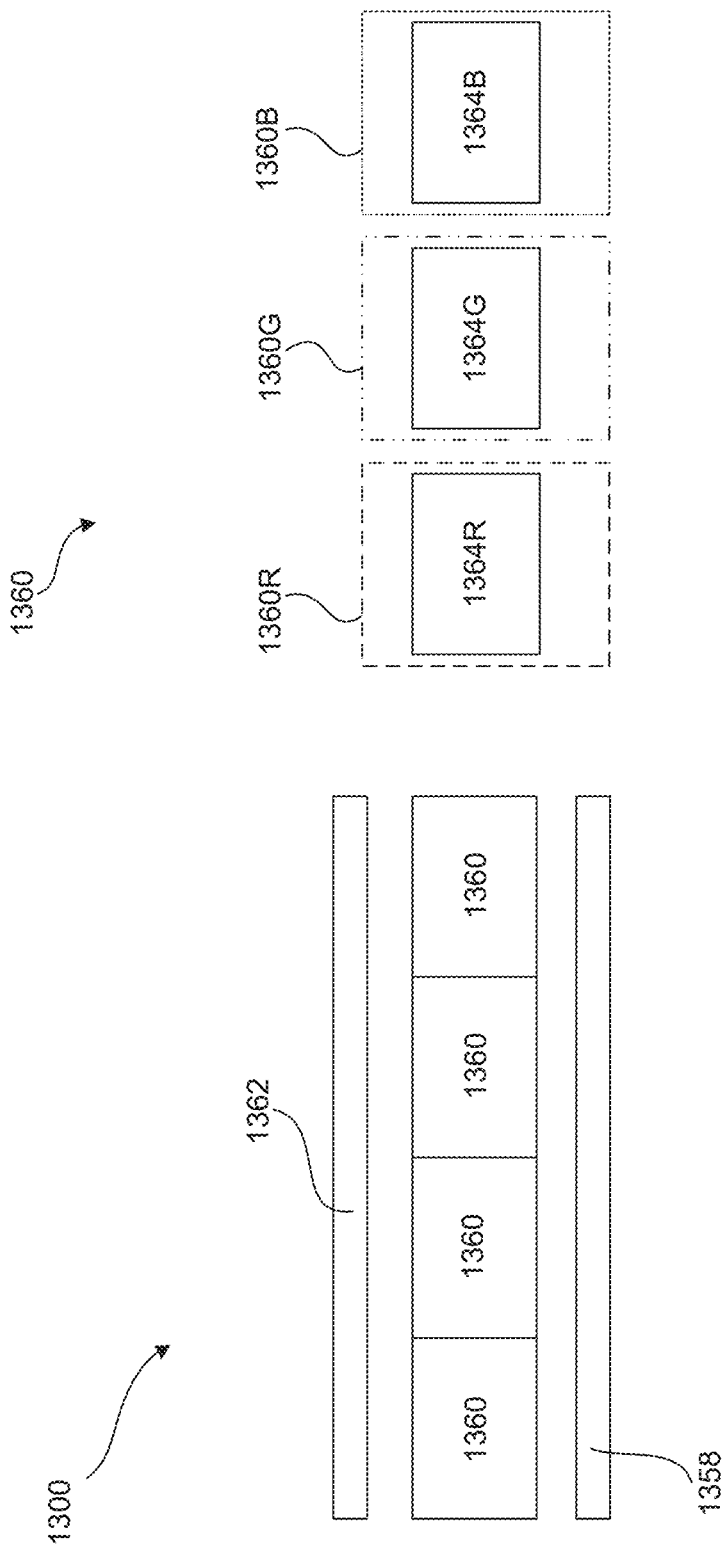
FIG. 13 is an exploded cross-sectional view of a light emitting diode (LED) display device, according to some embodiments.
FIG. 14 is a cross-sectional view of a pixel of an LED display device, according to some embodiments.

FIG. 13 illustrates a schematic of an exploded cross-sectional view of LED display device 1300, according to some embodiments. LED display device 1300 can include a back plate 1358, a plurality of pixels 1360 arranged in a 2-D array on back plate 1358, and a transmissive cover plate 1362, according to some embodiments. The number of pixels shown in FIG. 13 is illustrative and is not limiting. Device 1300 can have any number pixels without departing from the spirit and scope of this disclosure. LED display device 1300 can be referred as QD-LED display device if QD-based electroluminescent devices are used as light sources in pixels 1360.

Cover plate 1362 can serve as display screen to generate images and/or can be configured to provide environmental sealing to underlying structures of LED display device 1300. Cover plate 1362 can be also configured to be an optically transparent substrate on which other components (e.g., electrode) of LED display device 1300 can be disposed. In some embodiments, pixels 1360 can be tri-chromatic having red, green, and blue sub-pixels. In some embodiments, pixels 1360 can be monochromatic having either red, green, or blue sub-pixels. In some embodiments, LED display device 1300 can have a combination of both tri-chromatic and monochromatic pixels 1360.

LED display device 1300 can further include control circuitry (not shown) of pixels 1360. Pixels 1360 can be independently controlled by switching devices such as, for example, thin film transistors (TFTs). LED display device 1300 can have a geometric shape, such as but not limited to cylindrical, trapezoidal, spherical, or elliptical, according to various embodiments, without departing from the spirit and scope of the present invention. Though back plate 1358, array of pixels 1360, and cover plate 430 are shown in FIG. 13 to have similar dimensions along X-axis, each of these components can have dimensions different from each other in one or more directions, according to various embodiments.

FIG. 14 illustrates an exploded cross-sectional view of a tri-chromatic pixel 1360 of LED display device 1300, according to some embodiments. Pixel 1360 can include a red sub-pixel 1360R, a green sub-pixel 1360G, and a blue sub-pixel 1360B. The arrangement order of red, green, and blue sub-pixels 1360R, 1360G, and 1360B is illustrative and is not limiting. The red, green, and blue sub-pixels 1360R, 1360G, and 1360B can be arranged in any order with respect to each other.

Each of red, green, and blue sub-pixels 1360R, 1360G, and 1360B can include a respective electroluminescent devices 1364R, 1364G, and 1364B configured to provide respective primary red, green, and blue light that may be transmitted to and distributed across a display screen (e.g., cover plate 1362) of LED display device 1300. Electroluminescent devices 1364R, 1364G, and 1364B can be similar to electroluminescent devices 100 or 200 described with reference to FIGS. 1-12, except the material and size of QDs (e.g., QDs 324) in EMLs (e.g., EML 114) of electroluminescent devices 1364R, 1364G, and 1364B are different from each other. The size and material of the QDs of the EMLs of electroluminescent device 1364R, 1364G, and 1364B can be selected to emit light having a primary emission peak wavelength in the red, green, and blue wavelength region, respectively.

Example Embodiments of a Barrier Layer Coated Luminescent Nanostructure

Figure 15:
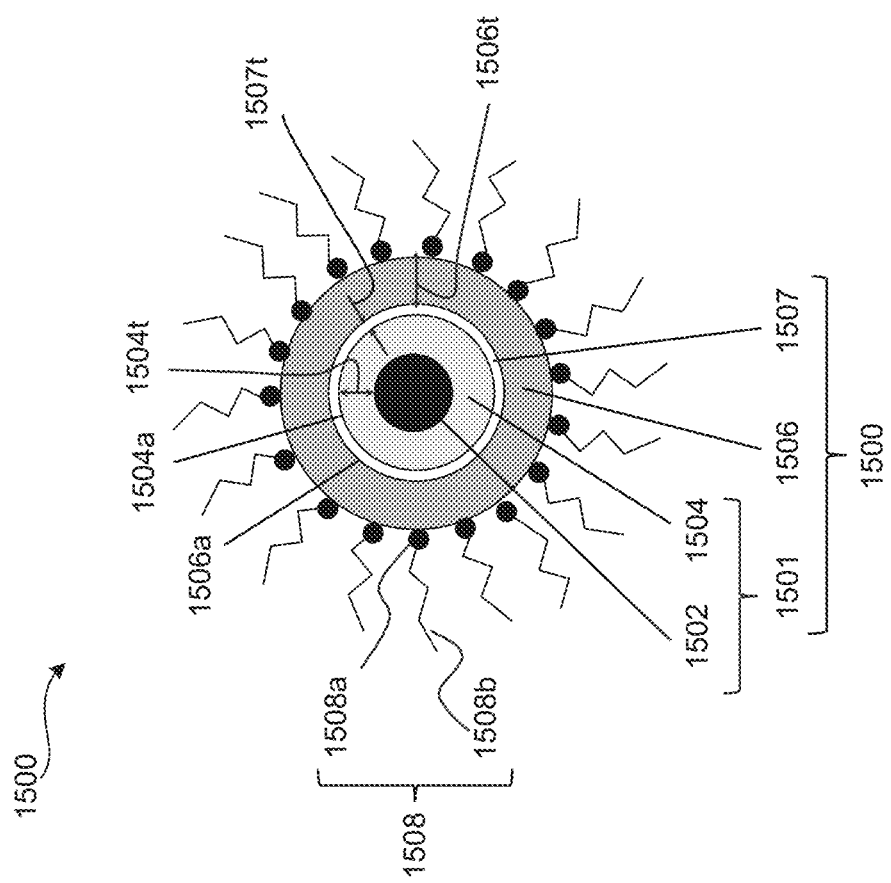
FIG. 15 is a schematic of a cross-sectional view of a nanostructure (NS), according to some embodiments.

FIG. 15 illustrates a cross-sectional structure of a barrier layer coated luminescent nanostructure (NS) 1500, according to some embodiments. In some embodiments, a population of NS 1500 can represent QDs 324 included in EML 114. Barrier layer coated NS 1500 includes a NS 1501 and a barrier layer 1506. NS 1501 includes a core 1502 and a shell 1504. Core 1502 includes a semiconducting material that emits light. Examples of the semiconducting material for core 1502 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap can be used as well. In an embodiment, core 1502 can also include one or more dopants such as metals, halogens, and alloys, to provide some examples. Examples of metal dopant can include, but not limited to, zinc (Zn), Copper (Cu), aluminum (Al), platinum (Pt), chrome (Cr), tungsten (W), palladium (Pd), or a combination thereof. Examples of a halogen dopant can include, but are not limited to, fluorine (F), chlorine (Cl), bromine (Br) or iodine (I). The presence of one or more dopants in core 1502 can improve structural, electrical, and/or optical stability and QY of NS 1501 compared to undoped NSs.

Core 1502 can have a size of less than 20 nm in diameter, according to some embodiments. In another embodiment, core 1502 can have a size between about 1 nm and about 10 nm in diameter. The ability to tailor the size of core 1502, and consequently the size of NS 1501 in the nanometer range enables photoemission coverage in the entire optical spectrum. In general, the larger NSs emit light towards the red end of the spectrum, while smaller NSs emit light towards the blue end of the spectrum. This effect arises as larger NSs have energy levels that are more closely spaced than the smaller NSs. This allows the NS to absorb photons containing less energy, i.e. those closer to the red end of the spectrum.

Shell 1504 surrounds core 1502 and is disposed on outer surface of core 1502. Shell 1504 can include, but is not limited to, cadmium sulfide (CdS), zinc cadmium sulfide (ZnCdS), zinc selenide sulfide (ZnSeS), and zinc sulfide (ZnS). In an embodiment, shell 1504 can have a thickness 1504*t*, for example, one or more monolayers. In other embodiments, shell 1504 can have a thickness 1504*t* between about 1 nm and about 10 nm. Shell 1504 can be utilized to help reduce the lattice mismatch with core 1502 and improve the QY of NS 1501. Shell 1504 can also help to passivate and remove surface trap states, such as dangling bonds, on core 1502 to increase QY of NS 1501. The presence of surface trap states can provide non-radiative recombination centers and contribute to lowered emission efficiency of NS 1501.

In alternate embodiments, NS 1501 can include a second shell disposed on shell 1504, or more than two shells surrounding core 1502, without departing from the spirit and scope of the present invention. In an embodiment, the second shell can be one or more monolayers thick and is typically, though not required, also a semiconducting material. Second shell can provide protection to core 1502. Second shell material can be zinc sulfide (ZnS), although other materials can be used, and dopants can be included as well, without deviating from the scope or spirit of the invention.

Barrier layer 1506 can be configured to form a coating on NS 1501. In an embodiment, barrier layer 1506 is disposed on and in substantial contact with outer surface 1504*a* of shell 1504. In embodiments of NS 1501 having one or more shells, barrier layer 1506 can be disposed on and in substantial contact with the outermost shell of NS 1501. In an example embodiment, barrier layer 1506 can be configured to act as a spacer between NS 1501 and one or more NSs in, for example, a solution, a composition, and/or a film having a plurality of NSs, where the plurality of NSs can be similar to NS 1501 and/or barrier layer coated NS 1500. In such NS solutions, NS compositions, and/or NS films, barrier layer 1506 can help to prevent aggregation of NS 1501 with adjacent NSs. Aggregation of NS 1501 with adjacent NSs can lead to increase in size of NS 1501 and consequent reduction or quenching in the optical emission properties of the aggregated NS (not shown) including NS 1501. In further embodiments, barrier layer 1506 provides protection to NS 1501 from, for example, moisture, air, and/or harsh environments (e.g., high temperatures and chemicals used during lithographic processing of NSs and/or during manufacturing process of NS based devices) that can adversely affect the structural and optical properties of NS 1501.

Barrier layer 1506 can include one or more materials that are amorphous, optically transparent and/or electrically inactive. Suitable barrier layers include inorganic materials, such as, but not limited to, inorganic oxides, halides, and/or nitrides. Examples of materials for barrier layer 1506 include oxides and/or nitrides of Al, Ba, Ca, Mg, Ni, Si, Ti, or Zr, according to various embodiments. Barrier layer 1506 can have a thickness 1506*t* ranging from about 0.5 nm to about 15 nm in various embodiments.

Barrier layer coated NS 1500 can additionally or optionally include a buffer layer 1507 configured to form a buffered coating on NS 1501. In an embodiment, buffer layer 1507 is disposed on shell 1504 and in substantial contact with outer surface 1504*a* of shell 1504 and inner surface 1506*a* of barrier layer 1506. Buffer layer 1507 can be configured to act as a buffer between NS 1501 and chemicals used during subsequent processing on NS 1501, such as, for example, formation of barrier layer 1506 on NS 1501.

Buffer layer 1507 can help to substantially reduce and/or prevent quenching in the optical emission properties of NS 1501 due to reaction with chemicals used during subsequent processing on NS 1501. Buffer layer 1507 can include one or more materials that are amorphous, optically transparent and/or electrically active. The one or more materials of buffer layer 1507 can include inorganic or organic materials. Examples of inorganic materials for buffer layer 1507 include oxides and/or nitrides of metals, according to various embodiments. Examples for metal oxides include ZnO, $TiO_2$, $In_2O_3$, $Ga_2O_3$, $SnO_2$, $Al_2O_3$, or MgO. Buffer layer 1507 can have a thickness 1507*t* ranging from about 1 nm to about 5 nm in various embodiments.

As illustrated in FIG. 15, barrier layer coated NS 1500 can additionally or optionally include a plurality of ligands or surfactants 1508, according to some embodiments. Ligands or surfactants 1508 can be adsorbed or bound to an outer surface of barrier layer coated NS 1500, such as on an outer surface of barrier layer 1506, or outer surface of shell 1504 or second shell, according to some embodiments. The plurality of ligands or surfactants 1508 can include hydrophilic or polar heads 1508a and hydrophobic or non-polar tails 1508b. The hydrophilic or polar heads 1508a can be bound to barrier layer 1506. The presence of ligands or surfactants 1508 can help to separate NS 1500 and/or NS 1501 from other NSs in, for example, a solution, a composition, and/or a film during their formation. If the NSs are allowed to aggregate during their formation, the quantum efficiency of NSs such as NS 1500 and/or NS 1501 can drop. Ligands or surfactants 1508 can also be used to impart certain properties to barrier layer coated NS 1500, such as hydrophobicity to provide miscibility in non-polar solvents, or to provide reaction sites (e.g., reverse micellar systems) for other compounds to bind.

A wide variety of ligands exist that can be used as ligands 1508. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is a thiol, for example, octanethiol. In some embodiments, the ligand is diphenylphosphine. In some embodiments, the ligand is a neutral salt of any of these fatty acids, or a chalcogenide of any of these amines, phosphines, or phosphine oxides, for example, zinc oleate, zinc laurate, TOP-selenide, or TOP-sulfide.

A wide variety of surfactants exist that can be used as surfactants 1508. Nonionic surfactants can be used as surfactants 1508 in some embodiments. Some examples of nonionic surfactants include polyoxyethylene (5) nonylphenylether (commercial name IGEPAL CO-520), polyoxyethylene (9) nonylphenylether (IGEPAL CO-630), octylphenoxy poly(ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), and polyoxyethylene branched nonylcyclohexyl ether (Triton N-101).

Anionic surfactants can be used as surfactants 1508 in some embodiments. Some examples of anionic surfactants include sodium dioctyl sulfosuccinate, sodium stearate, sodium lauryl sulfate, sodium monododecyl phosphate, sodium dodecylbenzenesulfonate, and sodium myristyl sulfate.

In some embodiments, NSs 1501 and/or 1500 can be synthesized to emit light in one or more various color ranges, such as red, orange, and/or yellow range. In some embodiments, NSs 1501 and/or 1500 can be synthesized to emit light in the green and/or yellow range. In some embodiments, NSs 1501 and/or 1500 can be synthesized emit light in the blue, indigo, violet, and/or ultra-violet range. In some embodiments, NSs 1501 and/or 1500 can be synthesized to have a primary emission peak wavelength between about 605 nm and about 650 nm, between about 510 nm and about 550 nm, or between about 300 nm and about 495 nm.

NSs 1501 and/or 1500 can be synthesized to display a high QY. In some embodiments, NSs 1501 and/or 1500 can be synthesized to display a QY between 80% and 100% or between 85% and 90%.

Thus, according to various embodiments, NSs 1500 can be synthesized such that the presence of barrier layer 1506 on NSs 1501 does not substantially change or quench the optical emission properties of NSs 1501.

Example Embodiments of a Nanostructure Film

Figure 16:
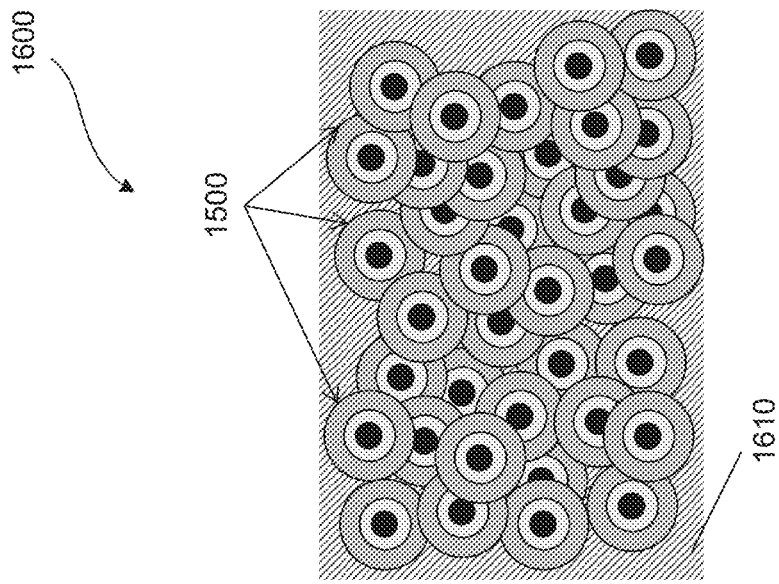
FIG. 16 is a schematic of a NS film, according to some embodiments.

FIG. 16 illustrates a cross-sectional view of a NS film 1600, according to some embodiments. In some embodiments, NS film 1600 can represent EML 114 of FIG. 5.

NS film 1600 can include a plurality of barrier layer coated core-shell NSs 1500 (FIG. 15) and a matrix material 1610, according to some embodiments. NSs 1500 can be embedded or otherwise disposed in matrix material 1610, according to some embodiments. As used herein, the term "embedded" is used to indicate that the NSs are enclosed or encased within matrix material 1610. It should be noted that NSs 1500 can be uniformly distributed throughout matrix material 1610 in an embodiment, though in other embodiments NSs 1500 can be distributed according to an application-specific uniformity distribution function. It should be noted that even though NSs 1500 are shown to have the same size in diameter, a person skilled in the art would understand that NSs 1500 can have a size distribution.

In an embodiment, NSs 1500 can include a homogenous population of NSs having sizes that emit in the blue visible wavelength spectrum, in the green visible wavelength spectrum, or in the red visible wavelength spectrum. In other embodiments, NSs 1500 can include a first population of NSs having sizes that emit in the blue visible wavelength spectrum, a second population of NSs having sizes that emit in the green visible wavelength spectrum, and a third population of NSs that emit in the red visible wavelength spectrum.

Matrix material 1610 can be any suitable host matrix material capable of housing NSs 1500. Suitable matrix materials can be chemically and optically compatible with NSs 1500 and any surrounding packaging materials or layers used in applying NS film 1600 to devices. Suitable matrix materials can include non-yellowing optical materials that are transparent to both the primary and secondary light, thereby allowing for both primary and secondary light to transmit through the matrix material. In an embodiment, matrix material 1610 can completely surround each of the NSs 1500. The matrix material 1610 can be flexible in applications where a flexible or moldable NS film 1600 is desired. Alternatively, matrix material 1610 can include a high-strength, non-flexible material.

Matrix material 1610 can include polymers, other semiconducting nanoparticles, organic and inorganic oxides, or other semiconducting or insulating materials. Suitable polymers for use in matrix material 1610 can be any polymer known to the ordinarily skilled artisan that can be used for such a purpose. The polymer can be substantially translucent or substantially transparent. Matrix material 1610 can include, but not limited to, epoxies, acrylates, norbornene, polyethylene, poly(vinyl butyral):poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with bifunctional monomers, such as divinylbenzene; cross-linkers suitable for cross-linking ligand materials, epoxides that combine with ligand amines (e.g., APS or PEI ligand amines) to form epoxy, and the like.

In some embodiments, matrix material 1610 includes scattering microbeads such as $TiO_2$ microbeads, ZnS microbeads, or glass microbeads that can improve photo conversion efficiency of NS film 1600. In some embodiments, matrix material 1610 can include conductive or semiconductive materials.

In another embodiment, matrix material 1610 can have low oxygen and moisture permeability, exhibit high photo- and chemical-stability, exhibit favorable refractive indices, and adhere to outer surfaces of NSs 1500, thus providing an air-tight seal to protect NSs 1500. In another embodiment, matrix material 1610 can be curable with UV or thermal curing methods to facilitate roll-to-roll processing.

According to some embodiments, NS film 1600 can be formed by mixing NSs 1500 in a polymer (e.g., photoresist) and casting the NS-polymer mixture on a substrate, mixing NSs 1500 with monomers and polymerizing them together, mixing NSs 1500 in a sol-gel to form an oxide, or any other method known to those skilled in the art.

Example Embodiments of Luminescent Nanostructures

Described herein are various compositions having luminescent nanostructures (NSs) that can represent QDs 324 of EML 114. The various properties of the luminescent nanostructures, including their absorption properties, emission properties and refractive index properties, can be tailored and adjusted for various applications.

The material properties of NSs can be substantially homogenous, or in some embodiments, can be heterogeneous. The optical properties of NSs can be determined by their particle size, chemical or surface composition. The ability to tailor the luminescent NS size in the range between about 1 nm and about 20 nm can enable photoemission coverage in the entire optical spectrum to offer great versatility in color rendering. Particle encapsulation can offer robustness against chemical and UV deteriorating agents.

Luminescent NSs, for use in embodiments described herein can be produced using any method known to those skilled in the art. Suitable methods and example nanocrystals are disclosed in U.S. Pat. No. 7,374,807; U.S. patent application Ser. No. 10/796,832, filed Mar. 10, 2004; U.S. Pat. No. 6,949,206; and U.S. Provisional Patent Application No. 60/578,236, filed Jun. 8, 2004, the disclosures of each of which are incorporated by reference herein in their entireties.

Luminescent NSs for use in embodiments described herein can be produced from any suitable material, including an inorganic material, and more suitably an inorganic conductive or semiconductive material. Suitable semiconductor materials can include those disclosed in U.S. patent application Ser. No. 10/796,832, and can include any type of semiconductor, including group II-VI, group III-V, group IV-VI, group and group IV semiconductors. Suitable semiconductor materials can include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SuS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, CuInGaS, CuInGaSe, and an appropriate combination of two or more such semiconductors.

In some embodiments, the luminescent NSs can have a dopant from the group consisting of a p-type dopant or an n-type dopant. The NSs can also have II-VI or III-V semiconductors. Examples of II-VI or III-V semiconductor NSs can include any combination of an element from Group II, such as Zn, Cd and Hg, with any element from Group VI, such as S, Se, Te and Po, of the Periodic Table; and any combination of an element from Group III, such as B, Al, Ga, In, and Tl, with any element from Group V, such as N, P, As, Sb and Bi, of the Periodic Table.

The luminescent NSs, described herein can also further include ligands conjugated, cooperated, associated or attached to their surface. Suitable ligands can include any group known to those skilled in the art, including those disclosed in U.S. Pat. No. 8,283,412; U.S. Patent Publication No. 2008/0237540; U.S. Patent Publication No. 2010/0110728; U.S. Pat. Nos. 8,563,133; 7,645,397; 7,374,807; 6,949,206; 7,572,393; and 7,267,875, the disclosures of each of which are incorporated herein by reference. Use of such ligands can enhance the ability of the luminescent NSs to incorporate into various solvents and matrixes, including polymers. Increasing the miscibility (i.e., the ability to be mixed without separation) of the luminescent NSs in various solvents and matrixes can allow them to be distributed throughout a polymeric composition such that the NSs do not aggregate together and therefore do not scatter light. Such ligands are described as "miscibility-enhancing" ligands herein.

In some embodiments, compositions having luminescent NSs distributed or embedded in a matrix material are provided. Suitable matrix materials can be any material known to the ordinarily skilled artisan, including polymeric materials, organic and inorganic oxides. Compositions described herein can be layers, encapsulants, coatings, sheets or films. It should be understood that in embodiments described herein where reference is made to a layer, polymeric layer, matrix, sheet or film, these terms are used interchangeably, and the embodiment so described is not limited to any one type of composition, but encompasses any matrix material or layer described herein or known in the art.

Down-converting NSs (for example, as disclosed in U.S. Pat. No. 7,374,807) utilize the emission properties of luminescent nanostructures that are tailored to absorb light of a particular wavelength and then emit at a second wavelength, thereby providing enhanced performance and efficiency of active sources (e.g., LEDs).

While any method known to the ordinarily skilled artisan can be used to create luminescent NSs, a solution-phase colloidal method for controlled growth of inorganic nanomaterial phosphors can be used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," J Am. Chem. Soc. 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," J Am. Chem. Soc. 115:8706 (1993), the disclosures of which are incorporated by reference herein in their entireties.

According to some embodiments, CdSe can be used as the NS material, in one example, for visible light down-conversion, due to the relative maturity of the synthesis of this material. Due to the use of a generic surface chemistry, it can also possible to substitute non-cadmium-containing NSs.

In semiconductor NSs, photo-induced emission arises from the band edge states of the NS. The band-edge emission from luminescent NSs competes with radiative and non-radiative decay channels originating from surface electronic states. X. Peng, et al., *J Am. Chem. Soc.* 30:7019-7029 (1997). As a result, the presence of surface defects such as dangling bonds provide non-radiative recombination centers and contribute to lowered emission efficiency. An efficient and permanent method to passivate and remove the surface trap states can be to epitaxially grow an inorganic shell material on the surface of the NS. X. Peng, et al., *J. Am. Chem. Soc.* 30:701 9-7029 (1997). The shell material can be chosen such that the electronic levels are type 1 with respect to the core material (e.g., with a larger bandgap to provide a potential step localizing the electron and hole to the core). As a result, the probability of non-radiative recombination can be reduced.

Core-shell structures can be obtained by adding organometallic precursors containing the shell materials to a reaction mixture containing the core NSs. In this case, rather than a nucleation event followed by growth, the cores act as the nuclei, and the shells can grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and to ensure solubility. A uniform and epitaxially grown shell can be obtained when there is a low lattice mismatch between the two materials.

Example materials for preparing core-shell luminescent NSs can include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTc, BeS, BcSe, BcTe, MgS, MgSe, GeS, GeSe, GeTe, SnS, SnSe, SnTe, PbO, PbS, PbSe, PbTe, CuP, CuCl, CuBr, CuI, $Si_3N_4$, $Ge_3N_4$, $Al_2O_3$, $(Al, Ga, In)_2 (S, Se, Te)_3$, AlCO, and shell luminescent NSs for use in the practice of the present invention include, but are not limited to, (represented as Core/Shell), CdSe/ZnS, InP/ZnS, InP/ZnSe, PbSe/PbS, CdSe/CdS, CdTe/CdS, CdTe/ZnS, as well as others.

Luminescent NSs for use in the embodiments described herein can be less than about 100 nm in size, and down to less than about 1 nm in size and absorb visible light. As used herein, visible light is electromagnetic radiation with wavelengths between about 380 and about 780 nanometers that is visible to the human eye. Visible light can be separated into the various colors of the spectrum, such as red, orange, yellow, green, blue, indigo and violet. Blue light can comprise light between about 435 nm and about 495 nm, green light can comprise light between about 495 nm and 570 nm and red light can comprise light between about 620 nm and about 750 nm in wavelength.

According to various embodiments, the luminescent NSs can have a size and a composition such that they absorb photons that are in the ultraviolet, near-infrared, and/or infrared spectra. The ultraviolet spectrum can comprise light between about 100 nm to about 400 nm, the near-infrared spectrum can comprise light between about 750 nm to about 100 μm in wavelength, and the infrared spectrum can comprise light between about 750 nm to about 300 μm in wavelength.

While luminescent NSs of other suitable material can be used in the various embodiments described herein, in some embodiments, the NSs can be ZnSe, ZnTe, ZnS, InAs, InP, CdSe, or any combination thereof to form a population of nanocrystals for use in the embodiments described herein. As discussed above, in further embodiments, the luminescent NSs can be core/shell nanocrystals, such as CdSe/ZnS, InP/ZnSe, CdSe/CdS or InP/ZnS.

Suitable luminescent nanostructures, methods of preparing luminescent nanostructures, including the addition of various solubility-enhancing ligands, can be found in Published U.S. Patent Publication No. 2012/0113672, the disclosure of which is incorporated by reference herein in its entirety.

It is to be understood that while some embodiments have been illustrated and described herein, the claims are not to be limited to the specific forms or arrangement of parts described and shown. In the specification, there have been disclosed illustrative embodiments and, although specific terms are employed, they are used in a generic and descriptive sense only and not for purposes of limitation. Modifications and variations of the embodiments are possible in light of the above teachings. It is therefore to be understood that the embodiments can be practiced otherwise than as specifically described.

What is claimed is:

1. An electroluminescent device comprising:
   a substrate;
   a first electrode disposed on the substrate;
   an emission layer comprising luminescent nanostructures disposed on the first electrode;
   a hybrid transport layer disposed on the emission layer, wherein the hybrid transport layer comprises an organic layer and inorganic nanostructures disposed within the organic layer, wherein the luminescent nanostructures are separated from the inorganic nanostructures by the organic layer, and wherein the organic layer and the luminescent nanostructures do not react chemically with each other; and
   a second electrode disposed on the hybrid transport layer.

2. The electroluminescent device of claim 1, wherein an organic material of the organic layer and an inorganic material of the inorganic nanostructures are soluble in a common organic solvent.

3. The electroluminescent device of claim 1, wherein an organic material of the organic layer and an inorganic material of the inorganic nanostructures are soluble in alcohol, acetone, or acetonitrile.

4. The electroluminescent device of claim 1, wherein the organic layer comprises an organic material with two or more phosphonic oxide functional groups (P=O).

5. The electroluminescent device of claim 1, wherein the organic layer comprises (1,3,5-Triazine-2,4,6-triyl)tris(benzene-3, 1-diyl)tris(diphenylphosphine oxide), 2,4,6-Tris [3-(diphenylphosphinyl)phenyl]-1,3,5-triazine, which has three phosphonic oxide functional groups (P=O).

6. The electroluminescent device of claim 1, wherein the inorganic nanostructures comprise a metal oxide.

7. The electroluminescent device of claim 1, wherein the inorganic nanostructures comprise diameters about 5 to about 20 times smaller than diameters of the luminescent nano structures.

8. The electroluminescent device of claim 1, wherein the luminescent nanostructures are disposed within a matrix material that is disposed on the emission layer.

9. The electroluminescent device of claim 1, wherein the luminescent nanostructures comprise a first population of quantum dots configured to emit red light and a second population of quantum dots configured to emit green light.

10. The electroluminescent device of claim 1, further comprising a hole transport layer disposed between the first electrode and the emission layer.

11. A display device comprising:
an array of pixels; and
a display screen disposed on the array of pixels,
wherein each pixel of the array of pixel comprises first and second electroluminescent devices, wherein each of the first and second electroluminescent devices comprises:
an emission layer comprising luminescent nanostructures, and
a hybrid transport layer disposed on the emission layer, wherein the hybrid transport layer comprises an organic layer and inorganic nanostructures,
wherein the emission layer of the first electroluminescent device is configured to emit a first light having a first peak wavelength, and
wherein the emission layer of the second electroluminescent device is configured to emit a second light having a second peak wavelength that is different from the first peak wavelength.

12. The display device of claim 11, wherein the inorganic nanostructures are disposed within the organic layer or on the organic layer.

13. The display device of claim 11, wherein the luminescent nanostructures are separated from the inorganic nanostructures by the organic layer.

14. The display device of claim 11, wherein the organic layer comprises an organic material with two or more phosphonic oxide functional groups (P=O).

15. The display device of claim 11, wherein an organic material of the organic layer and an inorganic material of the inorganic nanostructures are soluble in a common organic solvent.

* * * * *